United States Patent
Irsigler et al.

(10) Patent No.: US 10,121,691 B2
(45) Date of Patent: Nov. 6, 2018

(54) SEMICONDUCTOR SUBSTRATE ARRANGEMENTS AND A METHOD FOR FORMING A SEMICONDUCTOR SUBSTRATE ARRANGEMENT

(71) Applicant: Infineon Technologies AG, Neubiberg (DE)

(72) Inventors: Peter Irsigler, Obernberg/Inn (AT); Jens Peter Konrath, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/040,540

(22) Filed: Feb. 10, 2016

(65) Prior Publication Data

US 2016/0247703 A1   Aug. 25, 2016

(30) Foreign Application Priority Data

Feb. 25, 2015   (DE) .................. 10 2015 102 735

(51) Int. Cl.
| | |
|---|---|
| *H01L 21/00* | (2006.01) |
| *H01L 21/683* | (2006.01) |
| *H01L 29/20* | (2006.01) |
| *H01L 29/16* | (2006.01) |
| *H01L 21/02* | (2006.01) |

(Continued)

(52) U.S. Cl.
CPC ...... *H01L 21/6835* (2013.01); *H01L 21/0254* (2013.01); *H01L 21/02447* (2013.01); *H01L 21/02458* (2013.01); *H01L 21/02494* (2013.01); *H01L 21/02529* (2013.01); *H01L 21/0475* (2013.01); *H01L 21/30612* (2013.01); *H01L 29/1608* (2013.01); *H01L 29/2003* (2013.01); *H01L 2221/68363* (2013.01); *H01L 2221/68381* (2013.01)

(58) Field of Classification Search
CPC .......... H01L 21/02529; H01L 21/0254; H01L 21/6835; H01L 29/168; H01L 29/2003; H01L 29/2003; H01L 29/1608; H01L 21/02494; H01L 21/30612; H01L 21/0475; H01L 21/02447; H01L 21/02458
See application file for complete search history.

(56) References Cited

U.S. PATENT DOCUMENTS

| | | |
|---|---|---|
| 2012/0000415 A1 | 1/2012 | D'Evelyn |
| 2015/0118009 A1 | 4/2015 | Hsieh |

FOREIGN PATENT DOCUMENTS

| | | |
|---|---|---|
| CN | 102983093 A | 3/2013 |
| JP | 2006-315947 A | 11/2006 |
| JP | 2009-286652 A | 12/2009 |

(Continued)

OTHER PUBLICATIONS

Office Action communication of the German Patent and Trademark Office for Appln. Ser. No. 102015102735.6, dated Sep. 24, 2015.

(Continued)

*Primary Examiner* — Richard Booth
(74) *Attorney, Agent, or Firm* — Slater Matsil, LLP

(57) ABSTRACT

A semiconductor substrate arrangement includes a carrier wafer and a plurality of semiconductor substrate pieces fixed to the carrier wafer and distributed laterally over the carrier wafer. The semiconductor substrate pieces of the plurality of semiconductor substrate pieces comprise a hexagonal shape.

18 Claims, 9 Drawing Sheets

(51) Int. Cl.
*H01L 21/306* (2006.01)
*H01L 21/04* (2006.01)

(56) References Cited

FOREIGN PATENT DOCUMENTS

| | | |
|---|---|---|
| JP | 2012-1432 A | 1/2012 |
| JP | 2012-89613 A | 5/2012 |
| WO | WO 2005/069356 A | 7/2005 |

OTHER PUBLICATIONS

Office Action communication of the Japanese Patent and Trademark Office for Appln. No. 2016-033657.

SEMICONDUCTOR SUBSTRATE ARRANGEMENTS AND A METHOD FOR FORMING A SEMICONDUCTOR SUBSTRATE ARRANGEMENT

CROSS-REFERENCE TO RELATED APPLICATION

This application claims priority to German Application Serial No. 102015102735.6 filed Feb. 25, 2015 and entitled "Semiconductor Substrate Arrangements and a Method for Forming a Semiconductor Substrate Arrangement".

TECHNICAL FIELD

Embodiments relate to the manufacturing of semiconductor substrates and in particular to semiconductor substrate arrangements and a method for forming a semiconductor substrate arrangement.

BACKGROUND

Non-Silicon semiconductor wafers, e.g. made of silicon carbide (SiC), gallium arsenide (GaAs), gallium nitride (GaN) are not yet manufactured in sizes such as those currently used in production lines for processing silicon wafers.

As an example, for SiC the currently common size is 100 mm, whereas 150 mm wafers are becoming available. In the silicon manufacturing, sizes of 200 mm and 300 mm are common.

Larger crystal diameters are difficult to implement due to the more complex and technically demanding crystal growth of silicon carbide in comparison to silicon and the wafers are significantly more expensive (e.g. 10 times) than silicon wafers of same size.

SUMMARY

Some embodiments relate to a semiconductor substrate arrangement including a carrier wafer and a plurality of semiconductor substrate pieces fixed to the carrier wafer. The semiconductor substrate pieces of the plurality of semiconductor substrate pieces comprise a hexagonal shape.

Some embodiments relate to a semiconductor substrate arrangement comprising a carrier wafer and a plurality of semiconductor substrate pieces fixed to the carrier wafer. The semiconductor substrate pieces of the plurality of semiconductor substrate pieces comprise a maximal lateral dimension of less than 1 cm.

Some embodiments relate to a semiconductor substrate arrangement comprising a carrier wafer and a plurality of semiconductor substrate pieces fixed to a front side of the carrier wafer. The carrier wafer comprises a plurality of trenches at the front side.

Some embodiments relate to a method for forming a semiconductor substrate arrangement. The method comprises forming an epitaxial semiconductor layer on a plurality of semiconductor substrate pieces fixed to a carrier wafer so that the epitaxial semiconductor layer bridges gaps between neighboring edges of semiconductor substrate pieces of the plurality of semiconductor substrate pieces.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
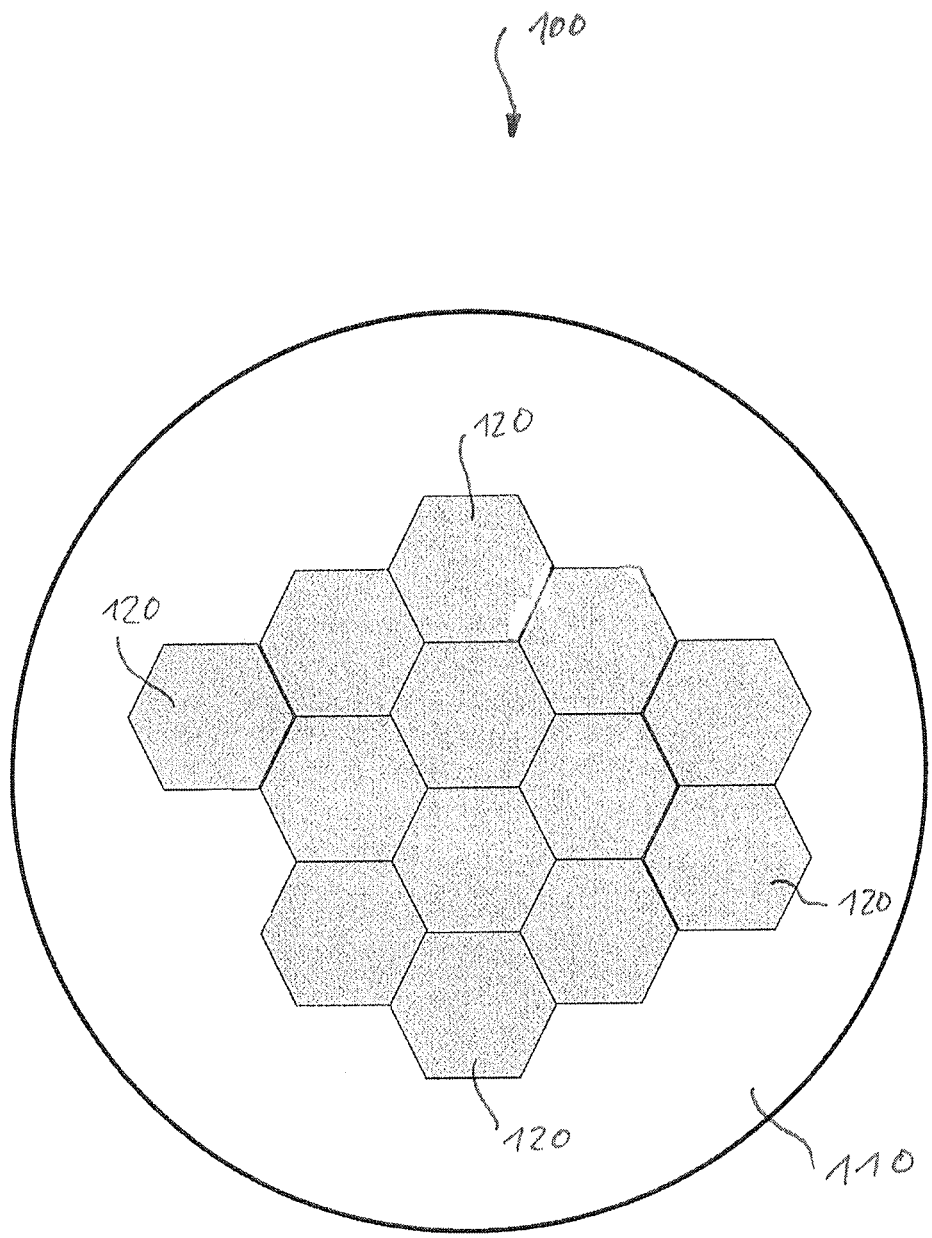
FIG. 1 shows a schematic illustration of a semiconductor substrate arrangement with hexagonal semiconductor substrate pieces.

FIG. 1 shows a schematic top view of semiconductor substrate arrangement according to an embodiment. The semiconductor substrate arrangement 100 comprises a carrier wafer 110 and a plurality of semiconductor substrate pieces 120 fixed to the carrier wafer 110. The semiconductor substrate pieces 120 of the plurality of semiconductor substrate pieces 120 comprise a hexagonal shape.

The wafer size of semiconductor substrate may be significantly increased by arranging small semiconductor substrate pieces on a larger carrier wafer. Further, the costs may be reduced. The surface of the carrier wafer may be covered in a very efficient way by using hexagonal semiconductor substrate pieces.

The semiconductor substrate pieces 120 of the plurality of semiconductor substrate pieces 120 may be distributed laterally over a front side surface of the carrier wafer 110. For example, each semiconductor substrate piece 120 of the plurality of semiconductor substrate pieces 120 is located adjacent to at least one other semiconductor substrate piece 120 of the plurality of semiconductor substrate pieces 120. A hexagonal semiconductor substrate piece may have up to six other hexagonal semiconductor substrate pieces being located adjacent to the edges of the hexagonal semiconductor substrate piece. The semiconductor substrate pieces 120 of the plurality of semiconductor substrate pieces 120 may be distributed over the carrier wafer 110 without lateral overlap. In other words, the semiconductor substrate pieces 120 may be arranged laterally next to each other, but not vertically stacked.

The semiconductor substrate pieces 120 of the plurality of semiconductor substrate pieces 120 may be bonded to the carrier wafer 110 or may be glued to the carrier wafer 110 to fix the pieces on the carrier wafer 110, for example.

The semiconductor substrate pieces 120 of the plurality of semiconductor substrate pieces 120 may be of substantially equal size (e.g. with a deviation of less than 5% of a maximal lateral dimension of the semiconductor substrate pieces) and/or substantially equal shape.

The plurality of semiconductor substrate pieces 120 may be a plurality of silicon carbide substrate pieces, a plurality of gallium nitride substrate pieces or a plurality of gallium arsenide substrate pieces. For example, hexagonal semiconductor substrate pieces may be obtained from semiconductor wafers in high quality and/or high yield (e.g. by splitting or cutting), if the semiconductor substrate pieces 120 are silicon carbide substrate pieces or gallium nitride substrate pieces, since silicon carbide and gallium nitride may comprise a hexagonal crystal structure.

Alternatively, the plurality of semiconductor substrate pieces 120 may be silicon substrate pieces. In this way, silicon substrate wafers with diameters of more than 400 mm may be obtainable.

The plurality of semiconductor substrate pieces 120 may comprise an arbitrary number of semiconductor substrate pieces 120. By using small semiconductor substrate pieces, the yield of semiconductor substrate pieces obtainable from a semiconductor wafer may be increased and/or the portion of the surface of the carrier wafer 110, which can be covered with substantially equal semiconductor substrate pieces, may be increased due to less waste at the edge of the carrier wafer 110, for example. For example, the plurality of semiconductor substrate pieces 120 comprises more than 10 semiconductor substrate pieces (or more than 20, more than 50 or more than 100).

For example, the semiconductor substrate pieces 120 of the plurality of semiconductor substrate pieces 120 may comprise a maximal lateral dimension of less than 1 cm (or less than 5 mm). The maximal lateral extension of a hexagon may be the distance between two opposite corners of the hexagon, for example.

The semiconductor substrate pieces 120 of the plurality of semiconductor substrate pieces 120 may comprise a thickness (vertical dimension) of more than 300 µm (or more than 50 µm, more than 100 µm, more than 200 µm or more than 500 µm).

The semiconductor substrate pieces 120 of the plurality of semiconductor substrate pieces 120 may be placed on the carrier wafer 110 with small distance to each other or as close as possible to each other. However, a small gap may remain between neighboring semiconductor substrate pieces due to limitations of the pick and place process and/or the straightness of the edges of the semiconductor substrate pieces 120. For example, a gap or distance (e.g. maximal distance) between neighboring edges of semiconductor substrate pieces of the plurality of semiconductor substrate pieces may be less than 5 µm (or less than 2 µm, less than 1 µm or less than 500 nm).

The semiconductor substrate pieces 120 of the plurality of semiconductor substrate pieces 120 may be aligned to each other during placement on the carrier wafer 110. In this way, the semiconductor substrate pieces 120 may be fixed on the carrier wafer 110 with substantially equal crystal orientation. For example, crystal directions of the semiconductor substrate pieces 120 of the plurality of semiconductor substrate pieces 120 are aligned to each other with a deviation of less than 5° (or less than 2°, less than 1° or less than 0.5°). In this way, a number of crystallographic defects within a layer grown on the semiconductor substrate pieces afterwards may be kept low.

The carrier wafer 110 may comprise a significantly larger size than the semiconductor substrate pieces 120. For example, the carrier wafer comprises a diameter of more than 180 mm (or more than 280 mm or more than 420 mm, e.g. 200 mm, 300 mm or 450 mm).

The semiconductor substrate pieces 120 of the plurality of semiconductor substrate pieces 120 may cover a majority of the surface (front side surface) of the carrier wafer 110. For example, more than 70% (or more than 80%, more than 90% or more than 95%) of a surface of the carrier wafer 110 may be covered by the semiconductor substrate pieces 120 of the plurality of semiconductor substrate pieces 120.

The carrier wafer 110 may be implemented by various materials or combination of materials. For example, the carrier wafer 110 may be a high-melting material wafer having a melting point above 1800° C. (or above 1900° C. or more than 2000° C.). In this way, the execution of subsequent high temperature process (e.g. epitaxial growth of semiconductor material) may be enabled, for example.

The carrier wafer 110 may comprise or consist of molybdenum, tantalum, tantalum carbide, tungsten, sapphire, graphite, carbon, ternary carbide or ternary nitride or a combination of two or more of these materials.

The carrier wafer 110 may comprise a circular shape. Alternatively, the carrier wafer 110 may comprise a non-circular shape. For example, the shape of the carrier wafer may be rectangular, quadratic or any other form than circular.

Optionally, the carrier wafer 110 may comprise an additional passivation layer covering at least a part of the carrier wafer (or at least the whole front side of the carrier wafer). For example, the passivation layer may comprise or consist of boron nitride.

Optionally, the carrier wafer 110 may comprise a plurality of trenches at the front side. In this way, mechanical stress between the carrier wafer 110 and the plurality of semiconductor substrate pieces 120 may be reduced. For example, neighboring trenches of the plurality of trenches may comprise a distance to each other of less than (or less than half) a maximal lateral dimension of the semiconductor substrate pieces 120 of the plurality of semiconductor substrate pieces 120. By implementing several trenches within the area covered by single semiconductor substrate pieces 120, the mechanical stress between the carrier wafer 110 and the plurality of semiconductor substrate pieces 120 may be further reduced.

The semiconductor substrate arrangement 100 may be used as a seed wafer for the growth of semiconductor substrates with large diameter or may be used for manufacturing semiconductor circuits on the semiconductor substrate arrangement 100.

Optionally, the plurality of semiconductor substrate pieces 120 may be covered by a semiconductor layer bridging the gaps between the plurality of semiconductor substrate pieces 120. In other words, the semiconductor substrate arrangement 100 may comprise additionally a grown semiconductor layer (e.g. epitaxial semiconductor layer) covering the semiconductor substrate pieces 120 of the plurality of semiconductor substrate pieces 120 and bridging the gaps between neighboring edges of semiconductor substrate pieces 120 of the plurality of semiconductor substrate pieces 120. In this way, a homogenous surface for implementing semiconductor devices on the semiconductor substrate arrangement 100 may be provided or an epitaxial semiconductor substrate with large diameter for transfer to another carrier wafer may be provided, for example.

Figure 2:
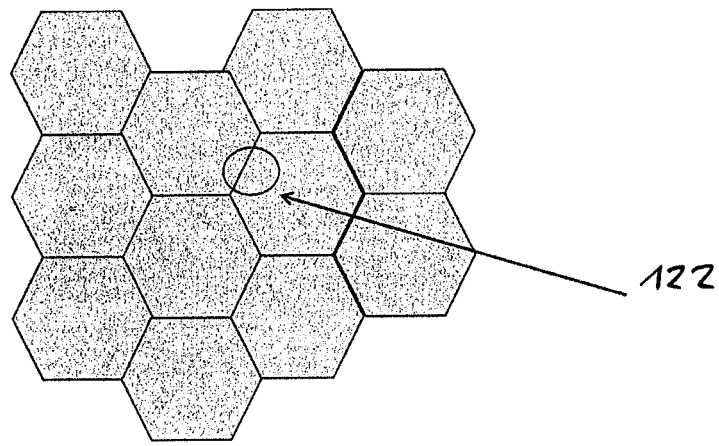
FIG. 2 shows a schematic illustration of hexagonal semiconductor substrate pieces.

FIG. 2 shows a schematic illustration of a plurality of hexagonal semiconductor substrate pieces 120. The semiconductor substrate pieces 120 are arranged close to each other, but gaps 122 may still remain between neighboring semiconductor substrate pieces 120.

Figure 3A:
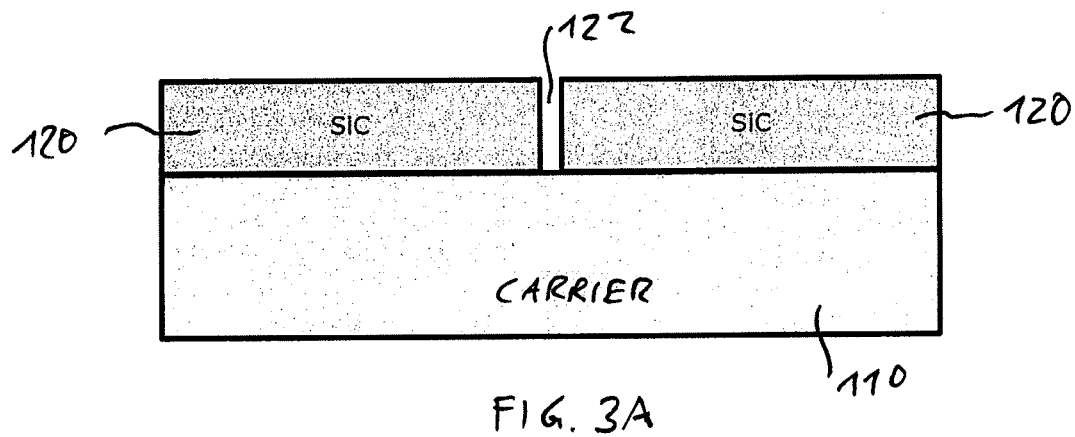
FIG. 3A shows a schematic cross section of a semiconductor substrate arrangement.

FIG. 3A shows a schematic cross section of a part of a semiconductor substrate arrangement with a gap 122 between two neighboring silicon carbide SiC substrate pieces 120 fixed to a carrier 110 (e.g. after bonding).

Figure 3B:
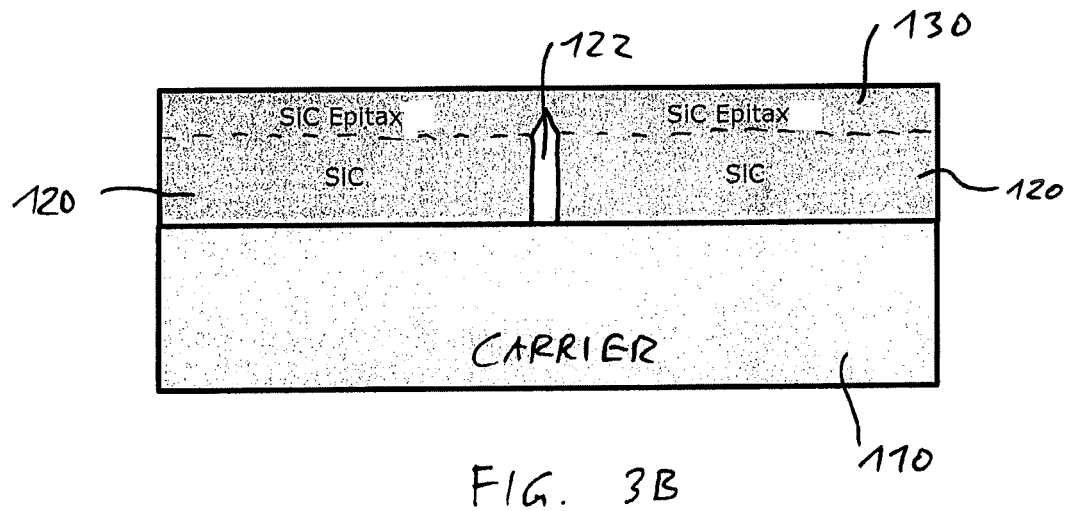
FIG. 3B shows a schematic cross section of a semiconductor substrate arrangement with a grown semiconductor layer.

FIG. 3B shows a schematic cross section of a part of a semiconductor substrate arrangement with a gap 122 between two neighboring silicon carbide SiC substrate pieces 120 fixed to a carrier 110 and a silicon carbide SiC epitaxial layer 130 grown on the neighboring silicon carbide SiC substrate pieces 120. The gap 122 may be closed due to a lateral growth during the manufacturing of the silicon carbide SiC epitaxial layer 130.

The semiconductor substrate arrangement of FIG. 3B may be obtained by further processing (growth of epitaxial layer over the gap) of the semiconductor substrate arrangement of FIG. 3A.

The semiconductor substrate arrangement of FIG. 3B may be used for the growth of further silicon carbide SiC epitaxial sub-layers to implement an epitaxial semiconductor layer with increased thickness and/or less crystal defects.

Optionally, a chemical-mechanical-polishing (CMP) process and further epi-growth and/or the Lely process may be performed.

Figure 4:
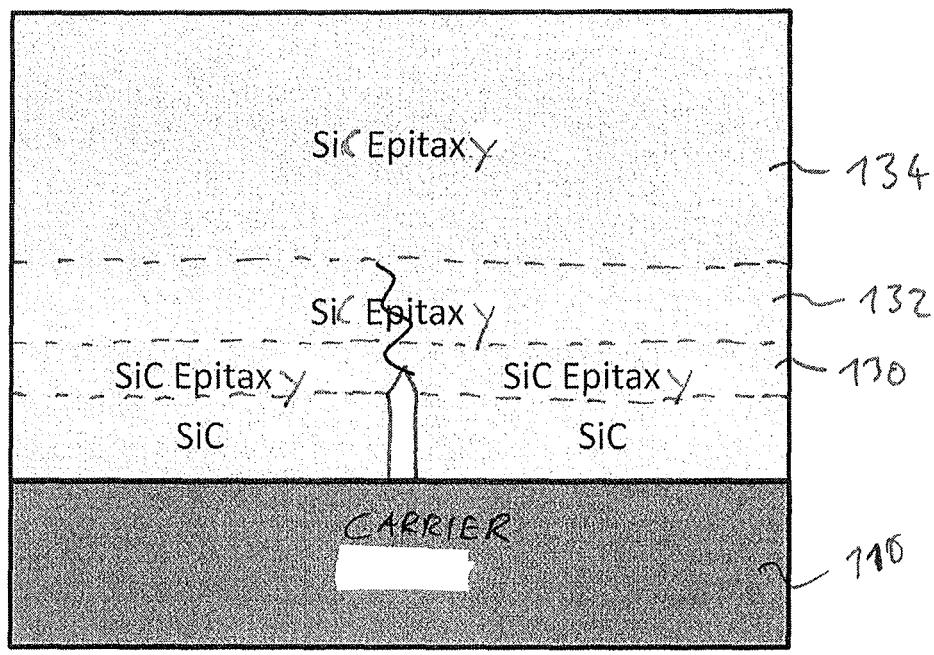
FIG. 4 shows a schematic cross section of a semiconductor substrate arrangement with several epitaxial semiconductor layers.

An example of a semiconductor substrate arrangement with a plurality of silicon carbide SiC epitaxial sub-layers 130, 132, 134 is shown by FIG. 4. An increased crystal defect density may occur in proximity to the gaps 122 between neighboring silicon carbide SiC substrate pieces 120. Several sub-layers 130, 132, 134 may be grown in order to reduce the crystal defect density with increasing distance to the gaps 122. Sub-layers may be etched back (e.g. in a hydrogen atmosphere) slightly before growing the next sub-layer. In this way, the crystal defect density may be further reduced within later sub-layers.

Figure 5:
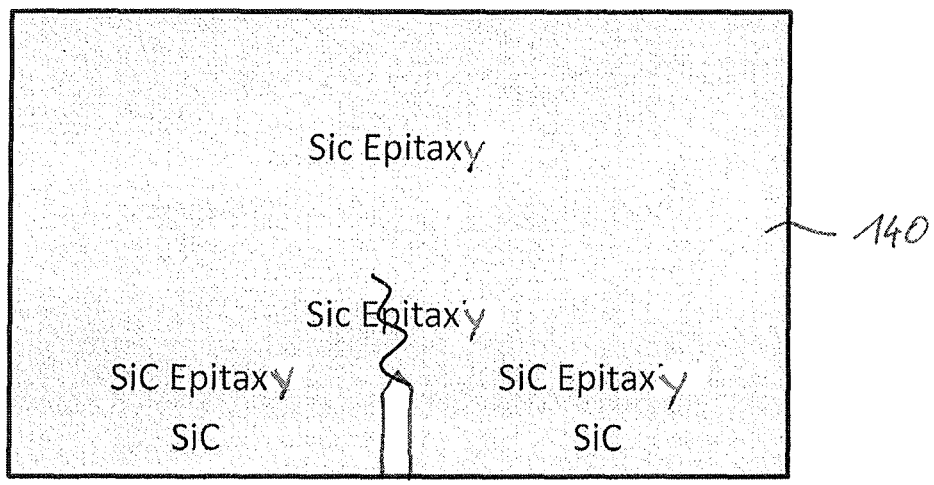
FIG. 5 shows a schematic cross section of a semiconductor substrate arrangement with several epitaxial semiconductor layers after removal of the carrier wafer.

After a desired thickness of the semiconductor material is reached, the carrier wafer may be removed as shown in FIG. 5.

Figure 6:
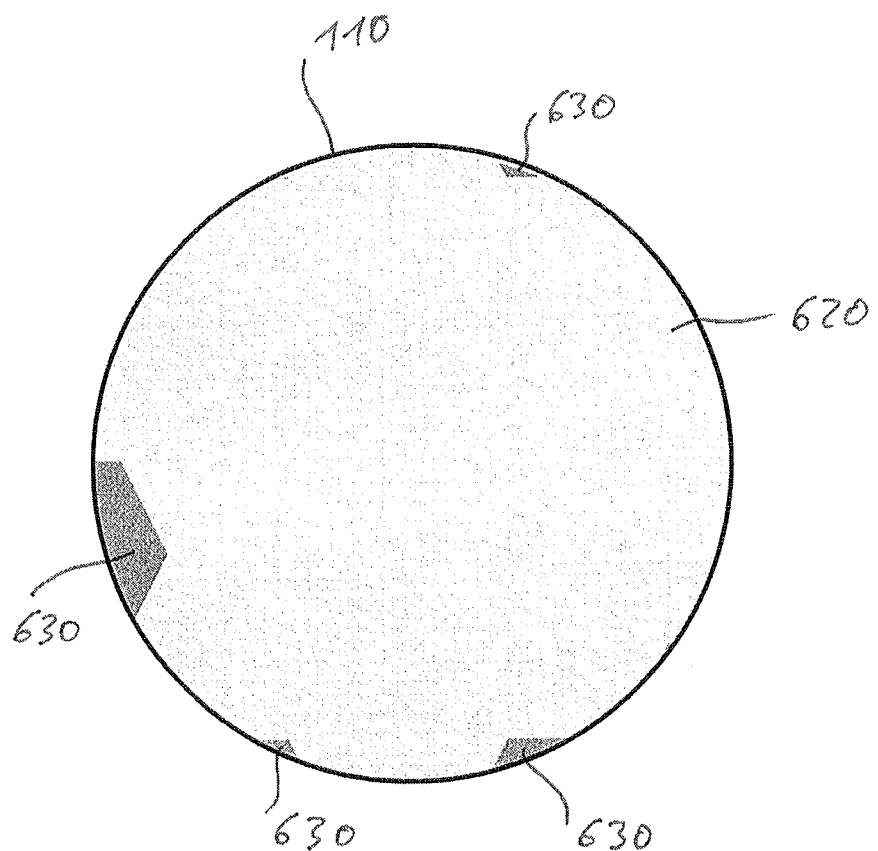
FIG. 6 shows a schematic top view of a semiconductor substrate arrangement after bridging gaps between semiconductor substrate pieces.

FIG. 6 shows a schematic top view of a semiconductor substrate arrangement after bridging gaps between semiconductor substrate pieces. The carrier wafer 110 is mainly covered by a continuous semiconductor substrate layer 620. Only small areas 630, which were not covered by semiconductor substrate pieces, may be uncovered by the continuous semiconductor substrate layer 620. Alternatively, the whole carrier wafer 110 may be covered by a continuous semiconductor substrate layer, if the whole carrier wafer 110 was covered with semiconductor substrate pieces before the growth of the continuous semiconductor substrate layer, for example. The semiconductor substrate arrangement may be a ready substrate with new diameter and the good properties of the small diameter as seed (semiconductor substrate pieces), for example.

Figure 7:
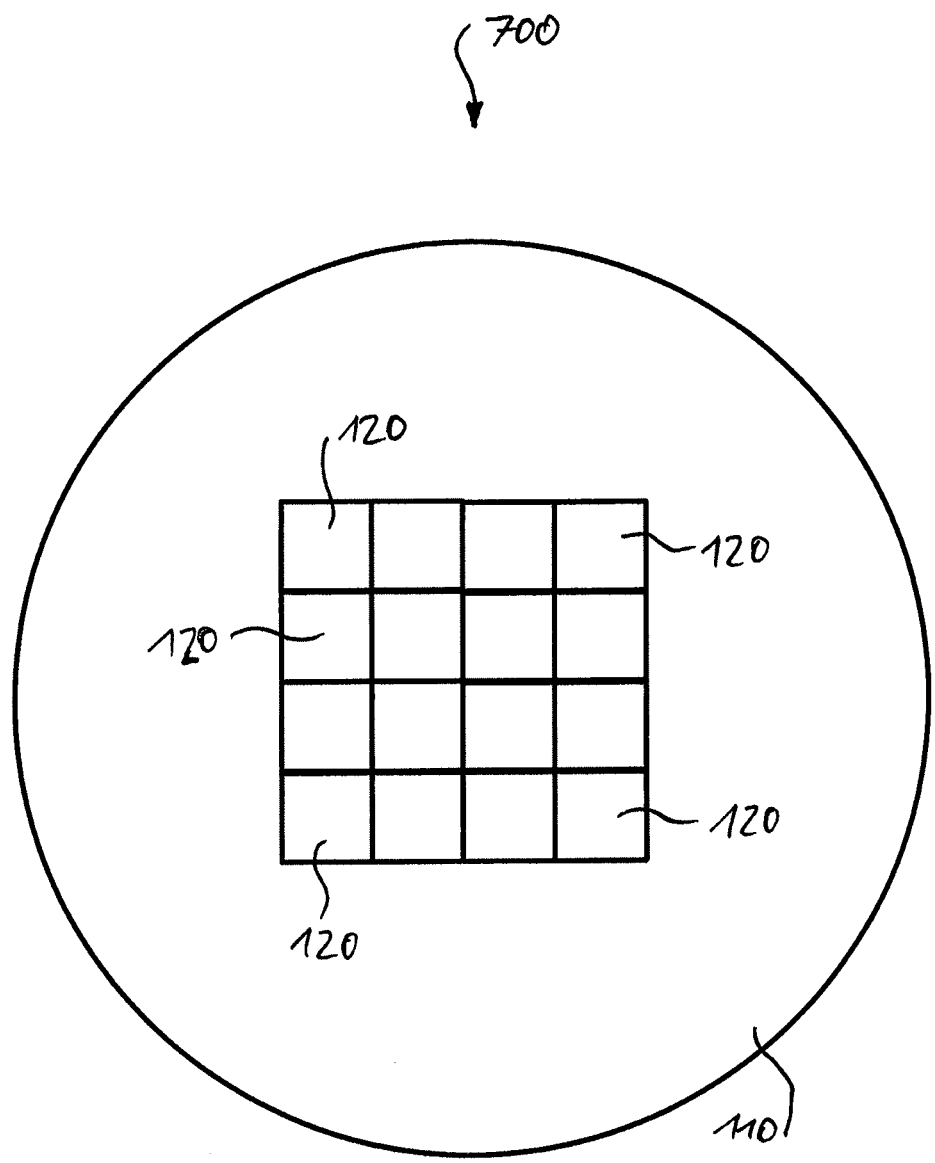
FIG. 7 shows a schematic illustration of a semiconductor substrate arrangement with a plurality of small semiconductor substrate pieces.

FIG. 7 shows a schematic top view of a semiconductor substrate arrangement according to an embodiment. The semiconductor substrate arrangement 700 comprises a carrier wafer 110 and a plurality of semiconductor substrate pieces 120 fixed to the carrier wafer 110. The semiconductor substrate pieces 120 of the plurality of semiconductor substrate pieces 120 comprise a maximal lateral dimension of less than 1 cm.

The wafer size of semiconductor substrates may be significantly increased by arranging small semiconductor substrate pieces on a larger carrier wafer. Further, the cost may be reduced. The surface of the carrier wafer may be covered in a very efficient way and/or the yield of manufacturing semiconductor substrate pieces from wafers with small diameter may be increased by using small semiconductor substrate pieces.

The maximal lateral dimension of a semiconductor substrate piece 120 of the plurality of semiconductor substrate pieces 120 may be a largest extension in a lateral direction along a front side surface of the carrier wafer 110. The maximal lateral dimension may depend on the shape and the size of the semiconductor substrate pieces 120.

For example, the semiconductor substrate piece 120 of the plurality of semiconductor substrate pieces 120 may comprise a hexagonal shape, a square shape, a rectangular shape, a quadrangle shape or a triangular shape, for example. The maximal lateral dimension of a hexagon may be the distance between two opposite corners of the hexagon, the maximal lateral dimension of a triangle may be the length of the longest edge of the triangle or the maximal lateral dimension of a rectangle may be the length of a diagonal, for example.

The semiconductor substrate pieces 120 of the plurality of semiconductor substrate pieces 120 of the semiconductor substrate arrangement 700 comprise a maximal lateral dimension of less than 1 cm. Alternatively, smaller semiconductor substrate pieces may be used. For example, the semiconductor substrate pieces 120 of the plurality of semiconductor substrate pieces 120 may comprise a maximal lateral dimension of less than 8 mm or less than 5 mm.

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIG. 1-6) or below (e.g. FIGS. 8-11).

Figure 8:
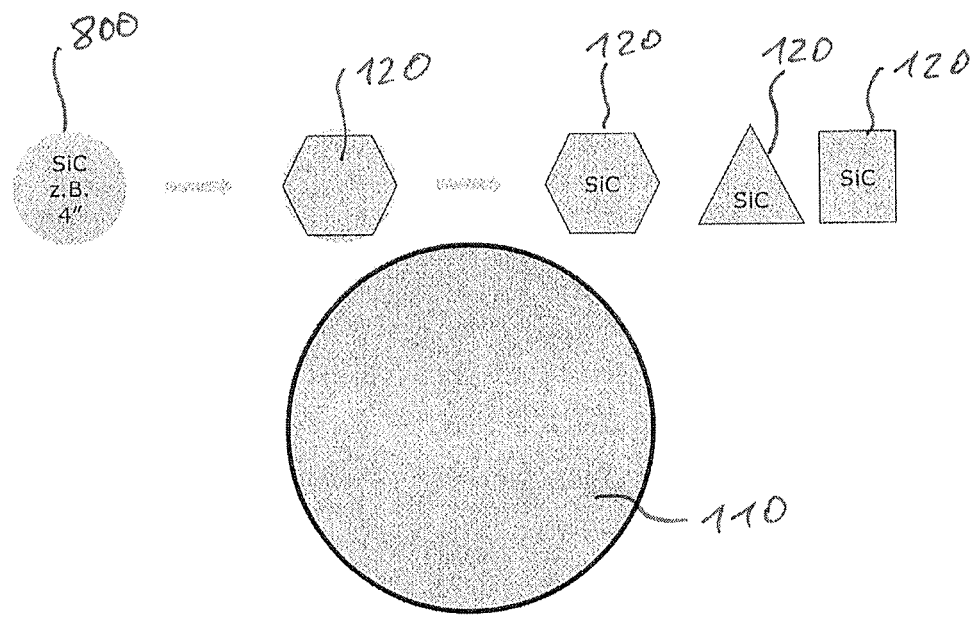
FIG. 8 shows a schematic illustration of semiconductor substrate pieces of different shape.

FIG. 8 shows a schematic illustration of the manufacturing of semiconductor substrate pieces 120 of different shape (e.g. hexagonal, triangular or rectangular) from a semiconductor wafers (e.g. SiC or GaN) of small diameter (e.g. 4"). Further, a carrier wafer 110 with large diameter (e.g. 12" or 18") before distribution of the semiconductor substrate pieces 120 is shown. The carrier wafer 110 may comprise or consist of carbon, graphite or tantalum carbide, for example.

Figure 9A:
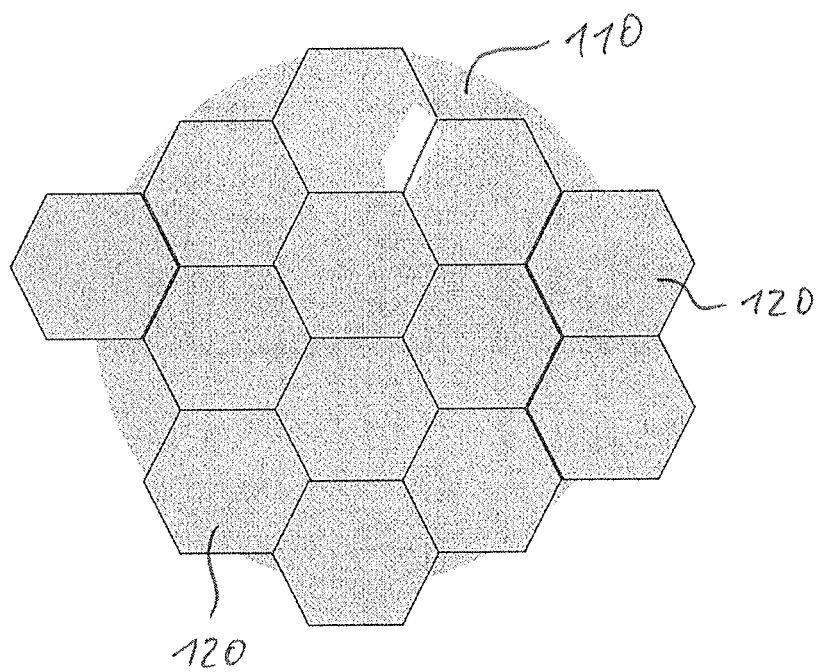
FIG. 9A shows a schematic illustration of a semiconductor substrate arrangement with a plurality of small hexagonal semiconductor substrate pieces.

FIG. 9A shows a schematic top view of a semiconductor substrate arrangement with a plurality of small hexagonal semiconductor substrate pieces 120. The small hexagonal (or triangular or rectangular) substrates 120 (semiconductor substrate pieces) may be bonded to the carrier 110 with very exact alignment and adjustment.

Figure 9B:
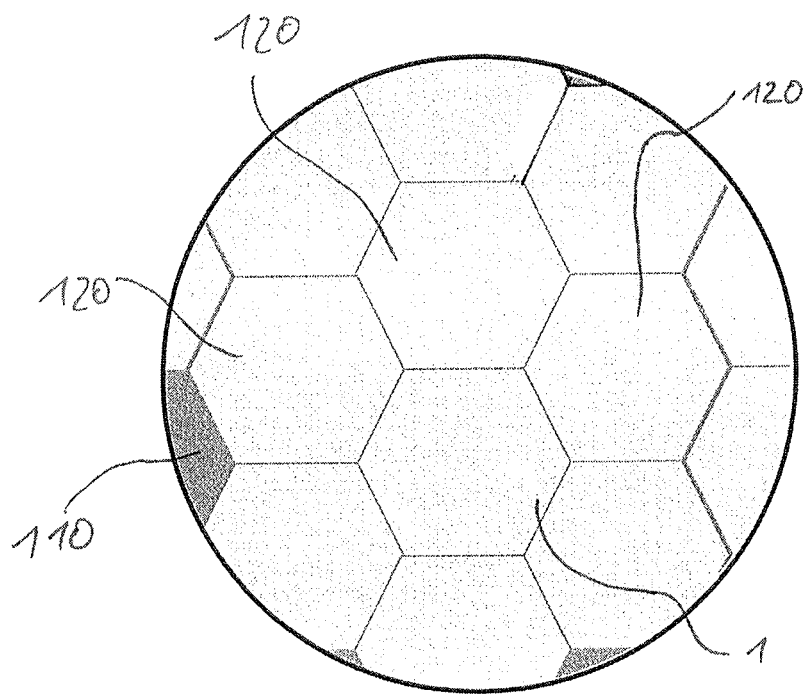
FIG. 9B shows a schematic illustration of a semiconductor substrate arrangement with a plurality of small hexagonal semiconductor substrate pieces after preparation to the desired diameter.

FIG. 9B shows a schematic top view of a semiconductor substrate arrangement with a plurality of small hexagonal semiconductor substrate pieces 120 prepared back to a desired diameter. For example, the semiconductor substrate pieces 120 hanging over the edge of the carrier wafer 110 of FIG. 9A may be cut (e.g. by laser cut or thermal laser separation TLS) so that the resulting semiconductor substrate arrangement comprises substantially the diameter of the carrier wafer 110.

Figure 10:
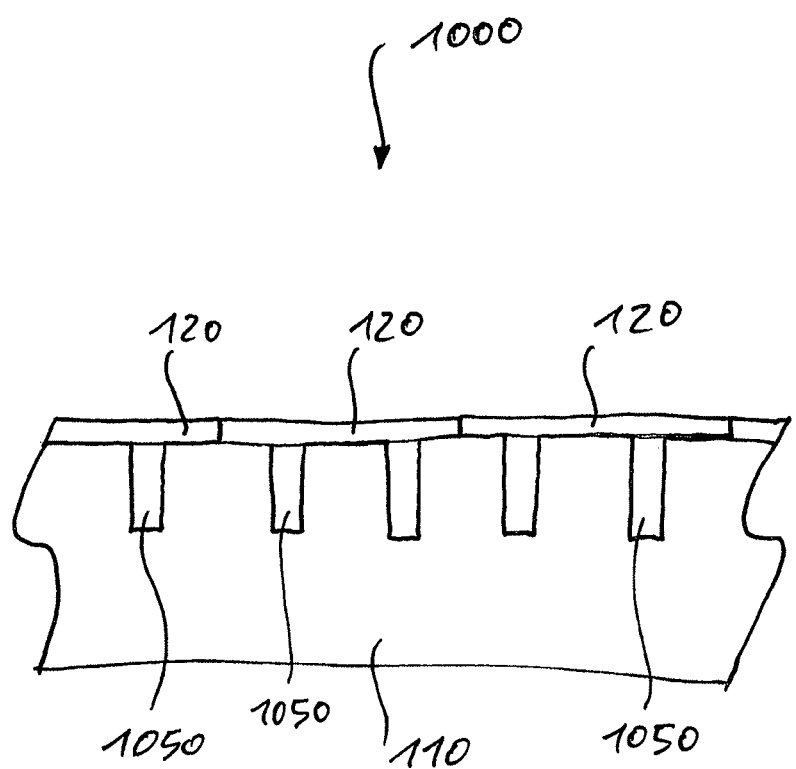
FIG. 10 shows a schematic illustration of a semiconductor substrate arrangement with a carrier wafer comprising trenches.

FIG. 10 shows a schematic top view of a semiconductor substrate arrangement according to an embodiment. The semiconductor substrate arrangement 1000 comprises a carrier wafer 110 and a plurality of semiconductor substrate pieces 120 fixed to a front side of the carrier wafer 110. The carrier wafer 110 comprises a plurality of trenches 1050 at the front side.

The mechanical stress between the carrier wafer 110 and the plurality of semiconductor substrate pieces 120 may be reduced by implementing trenches on the carrier wafer 110.

The trenches of the plurality of trenches 1050 at the front side of the carrier wafer 110 may comprise a lateral width of less than 100 μm (or less than 50 μm, less than 20 μm or less than 10 μm) and/or a depth of more than 1 μm (or more than 5 μm, more than 10 μm or more than 20 μm), for example.

For example, neighboring trenches of the plurality of trenches 1050 may comprise a distance to each other of less than (or less than half) a maximal lateral dimension of the semiconductor substrate pieces 120 of the plurality of semiconductor substrate pieces 120. By implementing several trenches within the area covered by single semiconductor substrate pieces 120, the mechanical stress between the carrier wafer 110 and the plurality of semiconductor substrate pieces 120 may be further reduced.

More details and aspects are mentioned in connection with the embodiments described above or below. The embodiment shown in FIG. 10 may comprise one or more optional additional features corresponding to one or more aspects mentioned in connection with the proposed concept or one or more embodiments described above (e.g. FIG. 1-9B) or below (e.g. FIG. 11).

Figure 11:
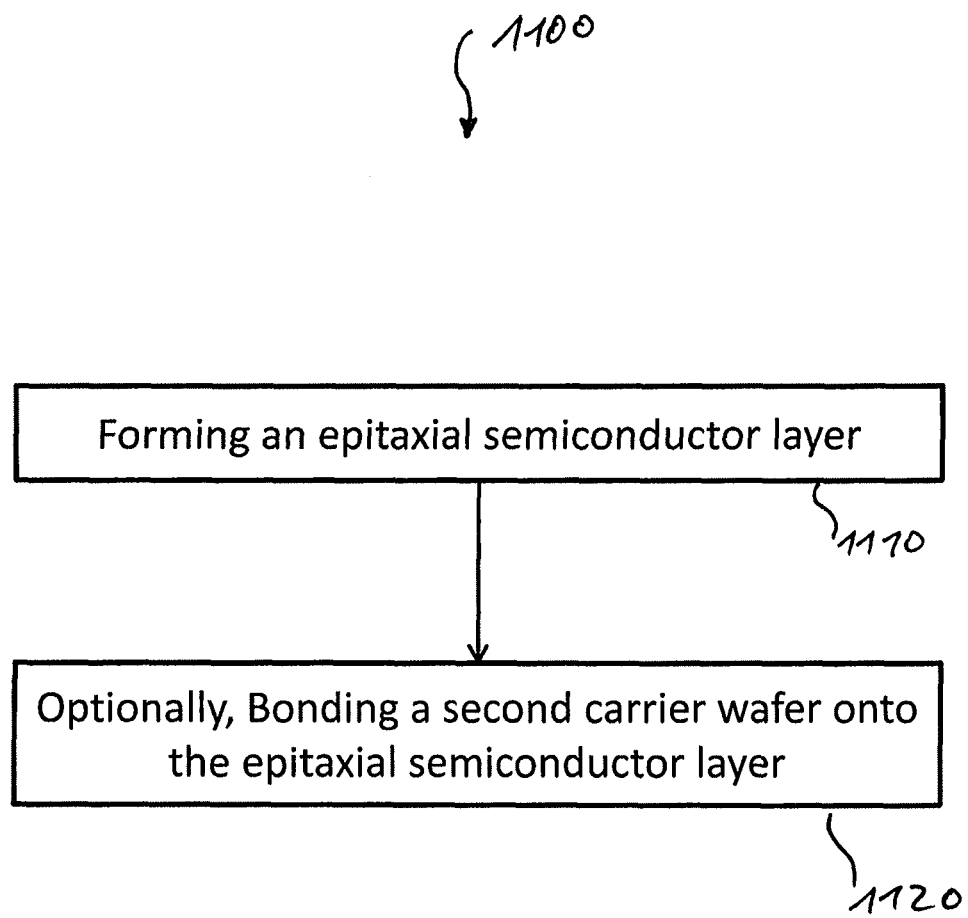
FIG. 11 shows a flow chart of a method for forming a semiconductor substrate arrangement.

FIG. 11 shows a flow chart of a method for forming a semiconductor substrate arrangement. The method 1100 comprises forming 1110 an epitaxial semiconductor layer on a plurality of semiconductor substrate pieces fixed to a carrier wafer so that the epitaxial semiconductor layer bridges gaps between neighboring edges of semiconductor substrate pieces of the plurality of semiconductor substrate pieces.

A continues semiconductor substrate with large diameter may be provided by forming an epitaxial semiconductor layer on a plurality of semiconductor substrate pieces fixed to a carrier wafer. In this way, large semiconductor substrates may be provided at low costs.

The plurality of semiconductor substrate pieces may be bonded or glued to the carrier wafer.

The epitaxial semiconductor layer may be grown by an epitaxial manufacturing process. For example, the forming of the epitaxial semiconductor layer may comprise etching-back semiconductor material (e.g. in a hydrogen atmosphere) and growing a sub-layer of the epitaxial semiconductor layer. Etching-back semiconductor material and growing a sub-layer of the epitaxial semiconductor layer may be repeated at least until the epitaxial semiconductor layer bridges the gaps between the neighboring edges of the semiconductor substrate pieces of the plurality of semiconductor substrate pieces.

For example, the plurality of semiconductor substrate pieces may be etched back in a hydrogen atmosphere and a first epitaxial semiconductor sub-layer may be grown (e.g. at temperatures between 1600° C. and 1800° C.). The first epitaxial semiconductor sub-layer may at least partly close the gap between neighboring semiconductor substrate pieces, for example. The process parameters for the growth of at least the first epitaxial semiconductor sub-layer may be selected so that a lateral growth at the edges of the semiconductor substrate pieces is increased. In this way, the gaps between the semiconductor substrate pieces may be closed very fast. Afterwards, the first epitaxial semiconductor sub-layer may be etched back in a hydrogen atmosphere and another epitaxial semiconductor sub-layer may be grown. The sequence of etching back and growing another sub-layer may be repeated until an epitaxial semiconductor layer with desired thickness is obtained. The crystal defect density above the gaps between the semiconductor substrate pieces may be reduced from sub-layer to sub-layer. The reduction of the crystal defect density may be further decreased due to the etch back between the growth of consecutive sub-layers.

The method 1600 may optionally comprise bonding 1120 a front side of a second carrier wafer onto the epitaxial semiconductor layer. In this way, the epitaxial semiconductor layer with large diameter may be transferred to another carrier layer and the first carrier layer may be used for the growth of a further epitaxial semiconductor layer.

Additionally, the method may comprise splitting the epitaxial semiconductor layer so that a part of the epitaxial semiconductor layer remains at the second carrier wafer.

Optionally, the second carrier wafer (e.g. carbon-based carrier wafer) comprises a plurality of trenches at the front side. The mechanical stress between the second carrier wafer and the part of the epitaxial semiconductor layer remaining at the second carrier wafer may be reduced by implementing trenches on the second carrier wafer.

More details and aspects are mentioned in connection with the embodiments described above or below. The embodiment shown in FIG. 11 may comprise one or more optional additional features corresponding to one or more aspects mentioned in connection with the proposed concept or one or more embodiments described above (e.g. FIG. 1-10) or below.

Some embodiments relate to SiC substrates with arbitrary diameter (e.g. 300 mm) or a method for manufacturing SiC substrates with arbitrary diameter.

For example, a 200 mm, 300 mm or 450 mm carrier wafer, which consists of or comprises high-melting material (e.g. Mo, Ta, W, sapphire, graphite, carbon, ternary carbide or ternary nitride), may be covered fully or nearly completely by bonding triangular, rectangular or hexagonal SiC wafer pieces to the carrier wafer. The carrier (e.g. carbon-based carriers) may be equipped with a passivation layer (e.g. SiC or boron nitride).

Afterwards, a SiC-layer as start wafer of high quality may be manufactured by several epitaxy acts and hydrogen etching in between. Possibly remaining cavities between the starting wafer pieces may be filled by lateral epitaxy.

Subsequently, an epitaxy of a drift layer or another start layer (e.g. representing a seed layer for further epitaxy processes) may be performed, which may be bonded to a further carrier and may be separated (e.g. wafer splitting, for example, by a smart cut process). The start wafer may be available for another epitaxy after a CMP process and may be reused arbitrary times. The split layer, which is bonded to the further carrier, may be thickened by a further epitaxy to reach a drift zone with sufficient thickness. The further carrier wafer may be a carbon-based carrier wafer, for example.

Alternatively, the start wafer may be used as seed for a modified Lely process (sublimation process, crystal growth process).

Some aspects relate to the manufacturing of larger SiC-Wafers (e.g. 200 mm or 300 mm diameter and larger) by bonding smaller pieces onto a carrier wafer and subsequent epitaxy processes. For example, a seed wafer or bar with large diameter may be manufactured by exact bonding of triangular, rectangular or hexagonal substrates with small diameter onto a high temperature substrate and following multiple epitaxy processes. Afterwards, a separation process of a seed layer may be done, which may be bonded to another suitable carrier wafer.

The described concept may be applicable to other materials than SiC also.

The high temperature substrate and/or the second carrier wafer may be implemented with trenches to reduce stress within the semiconductor layer, for example.

Some embodiments relate to a method for forming a semiconductor arrangement. The method comprises fixing a plurality of semiconductor substrate pieces to a carrier wafer. The semiconductor substrate pieces of the plurality of semiconductor substrate pieces comprise a hexagonal shape.

More details and aspects are mentioned in connection with the embodiments described above or below.

Some embodiments relate to a method for forming a semiconductor arrangement. The method comprises fixing a plurality of semiconductor substrate pieces to a carrier wafer. The semiconductor substrate pieces of the plurality of semiconductor substrate pieces comprise a maximal lateral dimension of less than 1 cm.

More details and aspects are mentioned in connection with the embodiments described above or below.

Some embodiments relate to a method for forming a semiconductor arrangement. The method comprises fixing a plurality of semiconductor substrate pieces to a front side of the carrier wafer. The carrier wafer comprises a plurality of trenches at the front side.

More details and aspects are mentioned in connection with the embodiments described above or below.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor substrate arrangement comprising:
   a carrier wafer;
   a plurality of semiconductor substrate pieces fixed to a front side of the carrier wafer, the plurality of semiconductor substrate pieces having a maximal lateral dimension, wherein the carrier wafer comprises a plurality of trenches in the front side of the carrier wafer, wherein:
   each distance between neighboring trenches of the plurality of trenches is less than the maximal lateral dimension of the semiconductor substrate pieces of the plurality of semiconductor substrate pieces; and
   the plurality of semiconductor substrate pieces are a plurality of wide band-gap semiconductor substrate pieces; and
   a grown semiconductor layer covering the semiconductor substrate pieces of the plurality of semiconductor substrate pieces and bridging gaps between neighboring edges of semiconductor substrate pieces of the plurality of semiconductor substrate pieces.

2. A semiconductor substrate arrangement comprising:
   a carrier wafer;
   a plurality of semiconductor substrate pieces fixed to the carrier wafer, wherein the carrier wafer comprises at least one of the group of graphite and carbon; and
   a grown semiconductor layer covering the semiconductor substrate pieces of the plurality of semiconductor substrate pieces and bridging gaps between neighboring edges of semiconductor substrate pieces of the plurality of semiconductor substrate pieces;
   wherein:
   the carrier wafer comprises a passivation layer covering at least a part of the carrier wafer, wherein the passivation layer comprises boron nitride; and
   the plurality of semiconductor substrate pieces are a plurality of wide band-gap semiconductor substrate pieces.

3. The semiconductor substrate arrangement of claim 1, wherein the semiconductor substrate pieces of the plurality of semiconductor substrate pieces comprise a hexagonal shape.

4. The semiconductor substrate arrangement of claim 1, wherein the semiconductor substrate pieces of the plurality of semiconductor substrate pieces comprise a maximal lateral dimension of less than 1 cm.

5. The semiconductor substrate arrangement of claim 1, wherein the plurality of semiconductor substrate pieces comprises more than 10 semiconductor substrate pieces.

6. The semiconductor substrate arrangement of claim 1, wherein the plurality of semiconductor substrate pieces is a plurality of silicon carbide substrate pieces or a plurality of gallium nitride substrate pieces.

7. The semiconductor substrate arrangement of claim 1, wherein a gap between neighboring edges of semiconductor substrate pieces of the plurality of semiconductor substrate pieces is less than 5 µm.

8. The semiconductor substrate arrangement of claim 1, wherein the semiconductor substrate pieces of the plurality of semiconductor substrate pieces are of substantially equal size and substantially equal shape.

9. The semiconductor substrate arrangement of claim 1, wherein crystal directions of the semiconductor substrate pieces of the plurality of semiconductor substrate pieces are aligned to each other with a deviation of less than 5°.

10. The semiconductor substrate arrangement of claim 1, wherein more than 70% of a surface of the carrier wafer is covered by the semiconductor substrate pieces of the plurality of semiconductor substrate pieces.

11. The semiconductor substrate arrangement of claim 1, wherein the carrier wafer comprises a diameter of more than 180 mm.

12. The semiconductor substrate arrangement of claim 1, wherein the carrier wafer is a high-melting material wafer having a melting point above 1800° C.

13. The semiconductor substrate arrangement of claim 1, wherein the carrier wafer comprises a non-circular shape.

14. The semiconductor substrate arrangement of claim 1, wherein the semiconductor substrate pieces of the plurality of semiconductor substrate pieces are distributed over the carrier wafer without lateral overlap.

15. The semiconductor substrate arrangement of claim 1, wherein the carrier wafer comprises a passivation layer covering at least a part of the carrier wafer, wherein the passivation layer comprises boron nitride.

16. The semiconductor substrate arrangement of claim 1, wherein each distance between neighboring trenches of the plurality of trenches is less than half the maximal lateral dimension of the semiconductor substrate pieces of the plurality of semiconductor substrate pieces.

17. A semiconductor substrate arrangement comprising:
    a carrier wafer;
    a plurality of semiconductor substrate pieces fixed to a front side of the carrier wafer, wherein the carrier wafer comprises a plurality of trenches at the front side; and
    a grown semiconductor layer covering the semiconductor substrate pieces of the plurality of semiconductor substrate pieces and bridging gaps between neighboring edges of semiconductor substrate pieces of the plurality of semiconductor substrate pieces;
    wherein neighboring trenches of the plurality of trenches comprise a distance to each other of less than a maximal lateral dimension of the semiconductor substrate pieces of the plurality of semiconductor substrate pieces.

18. The semiconductor substrate arrangement of claim 17, further comprising at least one epitaxial layer formed on the grown semiconductor layer covering the semiconductor substrate pieces.

* * * * *